United States Patent [19]
Roman

[11] 4,035,670
[45] July 12, 1977

[54] TRANSISTOR STORED CHARGE CONTROL USING A RECOMBINATION LAYER DIODE

[75] Inventor: Leonard F. Roman, North Hollywood, Calif.

[73] Assignee: California Linear Circuits, Inc., La Mirada, Calif.

[21] Appl. No.: 644,117

[22] Filed: Dec. 24, 1975

[51] Int. Cl.[2] .................. H01L 29/90; H03K 3/33; H03K 17/60; H03K 19/08

[52] U.S. Cl. .................. 307/300; 357/13; 357/64; 357/90; 307/281; 307/283; 307/319

[58] Field of Search .................. 357/13, 46, 64, 90; 307/283, 300, 302, 319, 281

[56] References Cited

U.S. PATENT DOCUMENTS

| | | | |
|---|---|---|---|
| 3,244,949 | 4/1966 | Hilbiber | 357/13 |
| 3,623,925 | 11/1971 | Jenkins et al. | 357/46 |
| 3,727,116 | 4/1973 | Thomas et al. | 357/64 |

FOREIGN PATENT DOCUMENTS

| | | | |
|---|---|---|---|
| 1,207,961 | 10/1970 | United Kingdom | 357/13 |

*Primary Examiner*—Andrew J. James
*Attorney, Agent, or Firm*—Howard A. Silber

[57] ABSTRACT

The on-to-off switching time of a junction transistor is reduced by forward connecting a recombination layer diode between the base and collector of the transistor. Preferably, the diode comprises a semiconductor abrupt junction of the type having a relatively heavily doped region of first conductivity type, a relatively lightly doped region of opposite conductivity type, and immediately adjacent the effective junction, a thin "recombination layer" of a carrier recombination-generation type material with a dopant concentration intermediate that of the two junction regions. Such a diode exhibits very low forward turn-on voltage and fast forward and reverse recovery times. The diode functions to bypass base-collector toward current of the transistor so as to reduce excess stored charge at the transistor collector-base junction, thereby effectively eliminating the storage delay time typically associated with junction transistor turn-off.

10 Claims, 5 Drawing Figures

WITHOUT DIODE 20

WITH DIODE 20

TRANSISTOR STORED CHARGE CONTROL USING A RECOMBINATION LAYER DIODE

BACKGROUND OF THE INVENTION

1. Field of the Invention

The present invention relates to stored charge control in a junction transistor, and more particularly to the use of a "recombination layer" diode to feedback clamp a junction transistor and thereby significantly reduce the transistor turn-off time.

2. Description of the Prior Art

One of the most common applications of a junction transistor is an on-off switch, somewhat analogous to a single pole, single throw electromechanical switch. In such application, a control voltage applied to the transistor base is used to switch the transistor from an OFF condition in which there is substantially no collector-emitter current, to an ON condition in which heavy current flows in the collector-emitter circuit.

For high speed switching operations it often is desirable to overdrive a junction transistor, thereby materially reducing the turn-on or rise time of the collector current. However, a penalty is accrued when such a transistor is overdriven to the on condition. When a junction transistor is saturated, the collector junction is forward biased. Thus, the collector is emitting carriers into the base, and as a result the density of excess minority carriers in the base next to the collector junction is abnormally large. When an attempt is made to turn off such a saturated transistor, the collector current cannot decrease until the excess minority carrier density near the base collector junction is reduced nearly to zero. Moreover, removal of these excess minority carriers in itself tends to support the current level in the collector leg during this turn-off time. Thus, a dead time or storage interval must transpire before the transistor starts to turn off.

A number of approaches have been used in the past to decrease the storage delay time in a junction transistor. For example, the transistor junctions may be gold doped to enhance carrier recombination. By providing additional recombination centers, the gold dopant ions speed up the clearing of excess minority carriers from the base region when the signal voltage supplied to the transistor base is turned off. While improving the transistor switching speed, gold doping significantly deteriorates other transistor characteristics such as minimum forward (collector-to-emitter) voltage drop, and minimum collector-base leakage.

Another approach of the prior art is to employ a clamping circuit to clamp the collector-emitter voltage drop of the transistor to a value somewhat greater than zero during the ON period to avoid saturation. Conventionally, such clamping circuits have utilized a diode forward connected between a clamping voltage source and the collector of the transistor, or alternatively, have employed a breakdown diode connected across the collector load.

While some feedback clamping circuits have been suggested, these normally require a diode fabricated of a semiconductor material having a significantly different band gap than that of the transistor semiconductor material. For example, when using a silicon transistor, a germanium forward clamping diode is required. Alternatively, a series-connected base resistor must be empolyed between the clamping diode and the transistor base. This clamping configuration not only requires an additional circuit component, but also necessitates higher drive voltage and/or current for circuit operation.

Thus no simple approach is known in the prior art for effectuating a significant reduction in the turn-off time of a junction transistor without the drawbacks enumerated above. In contradistinction, the present invention provides means for decreasing the on-to-off switching time of a junction transistor, while overcoming these and other shortcomings of the prior art.

SUMMARY OF THE INVENTION

In accordance with the present invention there is provided, as a circuit element, the combination of a junction transistor and a "recombination layer" diode forward connected between the base and collector of the transistor. Preferably, the recombination layer diode comprises a shallow, abrupt P-R-N junction having adjacent relatively highly doped and relatively lightly doped regions of opposite conductivity, and a thin, intermediately doped recombination layer immediately adjacent the junction.

Such a "recombination layer" diode, through fabricated of the same semiconductor material as the transistor, typically exhibits a forward turn-on voltage significantly lower than the forward base-to-emitter voltage of the transistor. Thus, when the transistor is turned on, the diode will be forward biased before the base-collector juntion. The diode thus effectively will clamp the transistor base-collector junction to a value somewhat greater than zero, and typically equal to the difference between the forward turn-on voltage of the diode and the base-to-emitter voltage of the transistor. This in turn will prevent saturation of the transistor, limit excess charge storage in the base region, and hence significantly reduce the storage delay time associated with transistor turn-off.

In a preferred embodiment, the recombination layer diode is of the type wherein the shallow, high dopant concentration region typically is from about 300 A to about 3000 A deep, and wherein the recombination layer has a thickness of from about 50 A to about 500 A. A more detailed description of such a diode, together with a discussion of typical fabrication techniques, therefore, is included in the inventor's co-pending application entitled "Ion-Implanted Semiconductor Abrupt Junction", U.S. Ser. No. 548,067.

Thus it is an object of the present invention to provide a novel means for decreasing the on-to-off switching time of a junction transistor.

Another object of the present invention is to provide, as a circuit element, the combination of a junction transistor and a diode forward connected between the base and collector of the transistor, the diode having an abrupt p-n junction and characterized by a very thin, intermediately doped layer immediately adjacent the p-n junction and functioning as a recombination region to substantially reduce minority carrier density beyond said recombination layer.

It is another object of the present invention to provide, in combination, a junction transistor and a recombination layer diode (P-R-N) forward connected between the base and collector of the transistor, both transistor and diode being formed of the same type semiconductor material, but with the diode exhibiting a significantly lower forward turn-on voltage than the base-to-emitter voltage of the transistor.

Still another object of the present invention is to provide a high-speed switching circuit comprising a junction transistor, a recombination layer diode forward connected between the base and collector of the transistor, and means for applying a signal to the base of the transistor, the collector-emitter current of the transistor exhibiting very fast turn-on and turn-off with essentially no storage delay time.

BRIEF DESCRIPTION OF THE DRAWINGS

Still other objects, features, and attendant advantages of the present invention will become apparent to those skilled in the art from a reading of the following detailed description of the preferred embodiments constructed in accordance therewith, taken in conjunction with the accompanying drawings wherein like numerals designate like parts in the several figures and wherein.

DESCRIPTION OF THE PREFERRED EMBODIMENT

Figure 1:
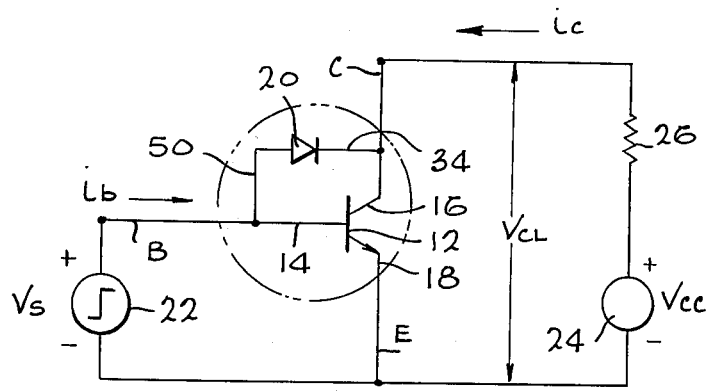
FIG. 1 is an electrical schematic diagram of a typical embodiment of the present invention, wherein the stored charge in a junction transistor is controlled using a "recombination layer" diode.

Referring now to the drawings, and particularly to FIG. 1 thereof, there is shown an electrical schematic diagram including a circuit element 10 in accordance with the present invention. In the embodiment shown, circuit element 10 includes a conventional N-P-N junction transistor 12 having a base 14, a collector 16 and an emitter 18. In FIG. 1, the electrical connections to base 14, collector 16 and emitter 18 are designated respectively B, C and E. Also included in circuit element 10 is a recombination layer diode 20 forward connected between base 14 and collector 16 of transistor 12. As will be discussed in detail herein below, diode 20 functions to control the charge stored in the collector-base junction of transistor 12, and thereby acts to decrease the on-to-off switching time of transistor 12. The characteristics of recombination layer diode 20 are described below in conjunction with FIGS. 2 and 3.

For ease of exposition, transistor 12 in FIG. 1 is shown connected in the common-emitter configuration. A control or signal voltage $V_s$ is supplied to base 14 from a source 22. The base current herein is designated $i_b$. A collector voltage $V_{cc}$ supplied from a dc source 24 is series connected via a load resistor 26 between the collector 16 and emitter 18 of transistor 12. The current flowing in this collector circuit is identified as $i_c$, while the collector-emitter voltage drop across transistor 12 herein is designated $V_{CL}$.

Figure 2:
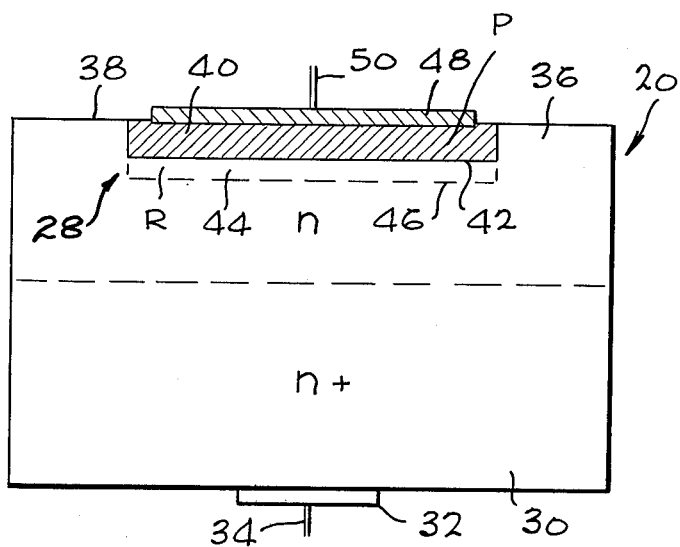
FIG. 2 is a greatly enlarged, sectional view of a "recombination layer" semiconductor diode such as might be employed in the circuit in FIG. 1.

Referring now to FIG. 2, it may be seen that semiconductor diode 20 incorporates a recombination layer junction 28 of a type described in detail in the aforementioned co-pending U.S. patent application entitled "Ion-Implanted Semiconductor Abrupt Junction".

Diode 20 comprises a semiconductor body having a heavily doped substrate portion 30. In the embodiment illustrated, substrate 30 is of n-type conductivity, and is provided with an ohmic contact 32 and an associated electrical conductor 34. Conductor 34 serves as the cathode connection to diode 20, and in the circuit of FIG. 1 is connected to the collector 16 of transistor 12.

Junction 28 (FIG. 2) comprises a relatively lightly doped region 36 of n-type conductivity. Extending into n region 36, from a major face 38 of device 20, is a very thin, relatively highly doped region 40 of conductivity type opposite that of region 36. In the embodiment of FIG. 2, region 40 is a p-type conductivity, and may be formed by ion implantation of an acceptor impurity such as boron, aluminum, gallium or indium. Preferably, the depth of p+ region 40 is between 300 Angstroms and about 3000 Angstroms.

Immediately below the lower edge 42 of p+ region 40 is a recombination layer or region 44 doped with a material such as gold, nickel, chrome, platinum, etc. In the embodiment of FIG. 2, recombination layer 44 has some p-type conductivity tendencies, may have a dopant concentration which is relatively light as compared to the concentration of region 40, but still somewhat greater than n-type region 36. Recombination layer 44 may be formed by ion implantation of the appropriate material. Preferably, the thickness of the recombination layer 44 is between about 50 Anstromes and about 500 Angstroms, the broken line 46 in FIG. 2 representing the lower boundary of recombination layer 44. An ohmic contact 48 is preferably a shallow layer of a metal such as aluminum instead of the standard evaporated or sputtered layer which must be subsequently sintered to the major face 38 to form a reliable ohmic contact, and a conductor 50 provide electrical connection to this region of junction 28. Conductor 50 functions as the anode contact to diode 20, and in the circuit of FIG. 1 is connected to base 14 of transistor 12.

Junction 28 may be fabricated using the equipment and technique set forth in the inventor's U.S. Pat. No. 3,437,734 entitled "Apparatus and Method for Effecting the Restructuring of Materials". Using this or other ion implantation equipment, p-type dopant ions (e.g., boron, aluminum, gallium or indium) can be imbedded into lightly doped, n-type body 36 to form p region 40. The ion implantation energy is adjusted so that the dopant ions when braked by the internal fields present within the semiconductor body will come to rest at a depth less than that of interface 42. That is, the energy is adjusted so that the majority of the implanted dopant ions will lie between surface 38 and a selected maximum depth in the range of from about 300 Angstroms to about 3000 Angstroms.

To form recombination layer 44, the ion implantation energy is increased slightly, for a period of time shorter than that used to form p region 40, during which shorter period of time appropriate dopant ions are embedded further into semiconductor region or body 36, typically to a depth of from 50 Angstroms to 500 Angstroms below interface 42.

Figure 3:
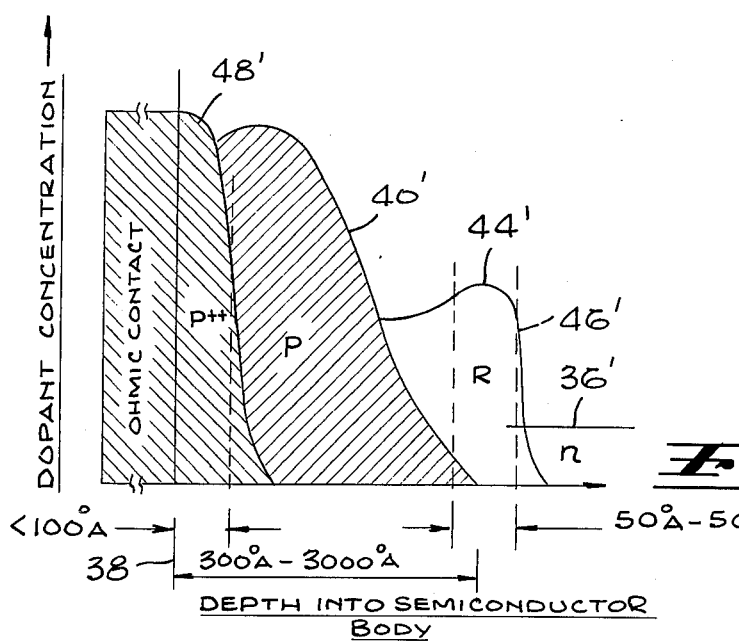
FIG. 3 is a graph showing dopant concentration as a function of depth into the semiconductor body for a typical p-n junction diode such as that shown in FIG. 2.

The relative dopant concentrations within a typical junction 28 of recombination layer diode 20 (FIG. 2) are illustrated by the graph of FIG. 3. As shown therein, the outline of shaded region 40' represents the dopant concentration profile for p region 40 (FIG. 2). Also evident in FIG. 3 is the concentration profile 44' of R-type recombination layer 44; note that layer 44 is characterized by a dopant concentration intermediate that of p region 40 and n region 36. The relatively low concentration of n-type dopant impurities in region 36 is illustrated by the line 36' in FIG. 3. The broken vertical line 46' designates the approximate lower boundary of recombination layer 44. The shaded region 48' represents the $p^{++}$ ohmic contact 48 which extends atop the major face 38.

Recombination layer diode 20 (FIGS. 2 and 3) typically exhibits much lower forward turn-on voltage, and significantly faster forward and reverse recovery times as compared with prior art diffused junction diodes formed of the same type of semiconductor material. Thus, a typical recombination layer (PRN) diode 20 formed of silicon may exhibit a forward turn-on voltage on the order of 0.2–0.3 volts, as compared with a turn-on voltage in the order of 0.6–0.7 volts for a silicon diode having a diffused junction, even when doped with a diffused recombination material such as gold.

The low forward turn-on voltage and the very fast forward and reverse recovery times exhibited by diode 20 result primarily from the additional recombination-generation centers provided by recombination layer 44. These centers are situated generally in positional correspondence with the forward biased depletion region of junction 28, and thus significantly decrease the time required to clear n and p regions 36 and 40 of excess stored minority carriers when the diode is switched from forward to reverse biased conditions.

The circuit of FIG. 1 advantageously utilizes the very fast switching times and low forward turn-on voltage of diode 20 to accomplish stored charge control in transistor 12.

Figure 4:
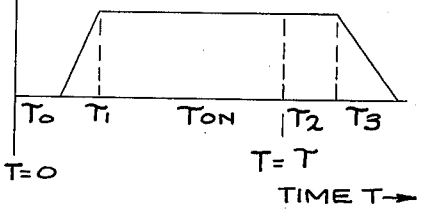
FIG. 4 is a graph showing collector current for an unclamped junction transistor during turn-on, saturated "on" condition, and turn-off.

To appreciate the role played by diode 20 in speeding up the turn-off time of transistor 12, the operation of transistor 12 by itself first must be considered. To this end, the graph of FIG. 4 shows the switching characteristics of a junction transistor without a clamping diode 20 connected between the collector and base thereof. At time $T = 0$, a square-wave control voltage $+V_s$ is applied to the base of the transistor. After a turn-on delay time $\tau_o$ associated with the time for the base-emitter junction of the transistor to become forward biased, a current $i_c$ begins to flow in the collector-emitter circuit of the transistor. The turn-on time $\tau_l$ is a measure of the time taken for the collector current to rise from zero to collector saturation level. Thereafter, the collector current $i_c$ remains at the saturation level until the control voltage $+V_s$ is abruptly turned off at time $T = \tau$.

During the time $\tau_{on}$ prior to $T = \tau$, while the transistor is saturated, the collector-base junction is forward biased, and the collector is injecting carriers into the base. As a result, the density of excess minority carriers in the base next to the collector junction is abnormally large. Thus at time $T = \tau$, when an attempt is made to turn off the transistor, the collector current $i_c$ cannot start to decrease until the excess minority carrier density in the base adjacent the collector junction is reduced to near zero. Since the removal of these excess minority carriers tends to support rather than decrease the current level in the collector leg, the current $i_c$ remains at a high level for a dead time or storage interval $\tau_2$ associated with the time to remove the excess minority carriers from the base region. Finally, there is the fall time $\tau_3$ taken for the base-emitter junction to become reverse biased.

From the foregoing discussion, it is apparent that the most significant factor controlling the on-to-off switching time of a junction transistor is the dead time or storage interval $\tau_2$. This storage interval is associated with the clearing of excess minority carriers from the base next to the collector junction, and results from saturation of the transistor during the ON period $\tau_{on}$. The utilization of recombination layer diode 20 (FIG. 1) to forward clamp junction transistor 12 significantly reduces or eliminates the storage time $\tau_2$ by effectively preventing transistor 12 from saturating during the on condition. Thus, with reference to the graph of FIG. 5, when the square-wave control voltage $+V_s$ is turned on at $T = 0$, there is a turn-on delay $\tau_o'$ associated with the time taken by the base 14-emitter 18 junction of transistor 12 to become forward biased. Of course, during this turn-on delay $\tau_o'$ the voltage $V_{CL}$ between collector 16 and emitter 18 of transistor 12 (FIG. 1) remains substantially equal to the voltage $V_{cc}$ supplied by source 24. This voltage $V_{CL}$ is sufficiently greater than the forward turn-on voltage of diode 20, so as to maintain diode 20 reverse biased with no current flow therethrough.

Figure 5:
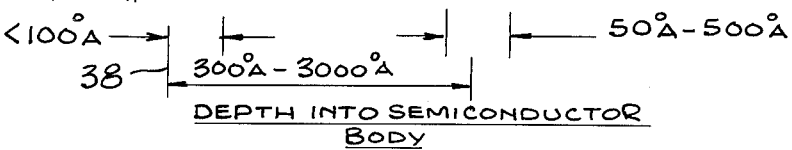
FIG. 5 is a graph showing tansistor collector current for the circuit shown in FIG. 1.

After the turn-on delay time $\tau_o'$, the collector current $i_c$ starts to increase during the turn-on time $\tau_l'$ (FIG. 5). As this current $i_c$ increases, the voltage $V_{CL}$ begins to decrease. If diode 20 were not utilized, the voltage $V_{CL}$ would go essentially to zero as the collector current $i_c$ increases to saturation level. However, with diode 20 connected as shown in FIG. 1, as the voltage $V_{CL}$ drops, the point is reached where diode 20 begins to forward conduct. The result of this forward conduction is to bypass the current supplied by $V_s$ around the base-collector junction while maintaining a voltage drop below that which would cause the base-collector junction to start conducting in the forward direction.

For a typical junction transistor 12 fabricated in silicon, the forward base-collector voltage is about 0.6 volts. As noted hereinabove, recombination layer diode 20 exhibits a very low forward turn-on voltage $V_F$. When fabricated of silicon, diode 20 typically may exhibit a turn-on voltage of approximately 0.2 volts. Thus, for the case of a silicon junction transistor 12 and a silicon recombination layer diode 20 connected as shown in FIG. 1, the collector current $i_c$ will increase during time $\tau_1'$ (FIG. 5) until the collector-emitter voltage drop decreases to a level $V_{CL}$ and sufficiently low so that the diode 20 goes into forward conduction.

Alternatively expressed, during the on-time $\tau_{on}'$ of transistor 12, the density of excess minority carriers in the transistor base region next to the collector-base junction will not become abnormally large or saturated.

As a result, when the control voltage $+V_s$ is turned off at time $T = \tau$, a very small amount of time is required to clear the base region of excess minority carriers. Accordingly, the collector current $i_c$ soon will begin to decrease during turn-off interval $\tau_3'$, with little or virtually no dead time or storage interval (analagous to dead time $\tau_2$ in FIG. 4).

It will thus be appreciated that utilization of recombination layer diode 20 effectuates a significant reduction in the turnoff time of the associated junction transistor 12, as compared with the performance of such transistor when operated without such a recombination layer forward clamping diode. Note that although there is a carrier storage time associated with diode 20 itself, recombination layer 44 functions to make this diode storage time very short. In particular, the forward and reverse recovery times exhibited by diode 20 typically are very short compared respectively with the turn-on time $\tau_1$ and turn-off time $\tau_3$ of transistor 12. As a result, the presence of diode 20 in circuit 10 will not increase the turn-on and turn-off times $\tau_1$ and $\tau_3$ associated with transistor 12.

While the foregoing description has been in terms of an N-P-N transistor 12, the invention is by no means so limited. Of course, a P-N-P junction transistor could be employed for transistor 12, with appropriate sign reversal of the control voltage $V_s$ and collector voltage $V_{cc}$. In addition, when using a P-N-P transistor, recombination layer diode 20 itself should be of polarity opposite that shown in FIGS. 2 and 3. That is, heavily doped region 40 and recombination layer 44 both should be of n-type conductivity, with region 36 and substrate 30 respectively of $p$ and $p^+$ conductivity. Such an PRN recombination layer diode readily may be fabricated by implantation of appropriate n-type dopant ions such as phosphorus, antimony, bismuth or arsenic into a p-type semiconductor body.

The PRN diode 20 utilized herein also may be fabricated using the technique described in U.S. Pat. No. 3,908,183 entitled COMBINED ION IMPLANTATION AND KINETIC TRANSPORT DEPOSITION PROCESS. Using such technique, the R region 44 and the $p$ region 40 may be formed by ion implantation at respectively greater and lessor implantation energies, while the ohmic contact 48 is formed by kinetic transport deposition.

For example, using this patented process, an acceptor impurity such as boron or aluminum may first be ion implanted to form the p-type region 40. Concurrently, some unionized material will be kinetically deposited atop the face 38 to begin formation of the ohmic contact. Subsequently, a material that produces recombination centers, e.g., gold, nickel, chrome or platinum, is ion implanted to a greater depth, but for a shoter time, to form the recombination layer 44. Then kinetic transport deposition of the same or a different material is continued, but without simultaneous ion implantation, to form the ohmic contact 48 of desired thickness.

While the invention has been described with respect to a preferred physical embodiment constructed in accordance therewith, it will be apparent to those skilled in the art that various modifications and improvements may be made without departing from the scope and spirit of the invention.

I claim:

1. As a circuit element, the combination of a junction transistor and a recombination layer diode forward connected between the base and collector of said transistor, said diode having a forward turn-on voltage that is lower than the forward base-to-emitter voltage of said transistor so that when said transistor is turned on, said diode will be forward biased before the base-collector junction of said transistor so as to prevent saturation of said transistor, the reverse recovery time of said diode being very short compared with the turn-off time of said transistor, so that connection of said diode will not increase the turn-off time of said transistor, said recombination layer diode comprising a shallow, relatively heavily doped region of one conductivity type, an adjacent relatively lightly doped region of opposite conductivity type, and a thin recombination layer between said shallow and said adjacent regions, of dopant concentration intermediate that of said shallow and said adjacent regions.

2. A circuit element as defined in claim 1 wherein the depth of said shallow region of said diode is between about 300 A and about 800 A, and wherein said recombination layer of said diode has a thickness between about 50 A and about 500 A.

3. A circuit element as defined in claim 1 wherein both said transistor and said diode are formed of silicon.

4. A circuit element as defined in claim 1 wherein said recombination layer is formed by ion implantation of an impurity that produces recombination centers.

5. A circuit element as defined in claim 1 wherein said recombination layer is doped with a material that produces recombination centers, said material being selected from the class consisting of gold, nickel, chrome and platinum.

6. Means for decreasing the on-to-off switching time of a junction transistor, said means comprising a shallow, abrupt prn diode forward connected between the base and collector of said junction transistor, said diode having a junction comprising adjacent relatively highly doped and relatively lightly doped regions of opposite conductivity type and an intermediately doped recombination layer at the junction interface, said diode having a forward turn-on voltage that is lower than the forward base-to-emitter voltage of said transistor so that when said transistor is turned on, said diode will be forward biased before the base-collector junction of said transistor and will prevent said base-collector junction from conducting in the forward direction, thereby preventing a buildup of excess minority carriers in the transistor base region, so that when said transistor is turned off, there will be no time lag to remove such excess minority carriers, said diode having a reverse recovery time that is very short compared with the turn-off time of said transistor.

7. Means as defined in claim 6 wherein said relatively highly doped region has a depth of between about 300 A and about 3000 A, and wherein said recombination layer has a thickness between about 50 A and 500 A and is immediately adjacent said highly doped region.

8. Means as defined in claim 6 wherein said recombination layer contains a dopant that provides recombination centers.

9. A high speed switching circuit comprising:
a junction transistor,
a diode forward connected between the base and the collector of said junction transistor, said diode including a shallow, abrupt PRN junction having adjacent relatively highly doped and relatively lightly doped regions separated by a thin intermediately doped region of a carrier recombination-generation type material, said diode having a forward turn-on voltage that is significantly lower than the forward base-emitter voltage of said transistor,
a load connected to the collector of said transistor, and means for applying a control voltage to the base of said transistor, said voltage turning on said transistor, said diode feedback clamping the transistor output voltage to the difference between the forward base-emitter voltage of said transistor and the forward turn-on voltage of said diode, said clamping limiting buildup of excess stored charge adjacent the collector-base junction of said transistor and hence decreasing the storage delay time associated with turn-off of said transistor.

10. The invention as defined in claim 9 including an ohmic contact formed above said PRN junction by kinetic transport deposition, said highly doped and said intermediately doped regions being formed by ion implantation.

* * * * *